United States Patent [19]
Mercer et al.

[11] Patent Number: 5,179,188
[45] Date of Patent: Jan. 12, 1993

[54] CROSSLINKABLE FLUORINATED AROMATIC ETHER COMPOSITION

[75] Inventors: Frank W. Mercer, Belmont; Timothy D. Goodman, Redwood City; Aldrich N. K. Lau, Palo Alto; Lanchi P. Vo, San Jose, all of Calif.

[73] Assignee: Raychem Corporation, Menlo Park, Calif.

[21] Appl. No.: 689,212

[22] Filed: Apr. 22, 1991

Related U.S. Application Data

[63] Continuation-in-part of Ser. No. 583,899, Sep. 17, 1990, and a continuation-in-part of Ser. No. 583,900, Sep. 17, 1990, and a continuation-in-part of Ser. No. 510,353, Apr. 17, 1990, and a continuation-in-part of Ser. No. 510,386, Apr. 17, 1990.

[51] Int. Cl.$^5$ .............. C08G 65/40; C08G 65/48
[52] U.S. Cl. .............. 528/219; 204/157.63; 204/157.92; 428/411.1; 522/181; 525/390; 526/247; 526/262; 526/279; 528/32; 528/170; 528/205; 528/216
[58] Field of Search ........... 528/219, 206, 205, 170, 528/32; 526/262, 247, 279

[56] References Cited

U.S. PATENT DOCUMENTS

| | | | |
|---|---|---|---|
| 4,732,843 | 3/1988 | Budde et al. | 430/312 |
| 4,744,007 | 5/1988 | Watari et al. | 361/386 |
| 4,835,197 | 5/1989 | Mercer | 524/538 |
| 4,946,949 | 8/1990 | Wolfe et al. | 534/885 |

FOREIGN PATENT DOCUMENTS 0193370  9/1986  European Pat. Off. .............. 220/58

OTHER PUBLICATIONS

Denton et al., J. Electronic Mater, vol. 14, p. 119 (1985).
"Microelectronics Packaging Handbook," Tummala et al. (eds.), pp. 687-692 (van Nostrand Reinhold).
Labadie et al., Sampe J. vol. 25, pp. 18-22 (Nov./Dec. 1989).
Kellman et al., ACS Symp. Ser. 326, Phase Transfer Catalysis, p. 128 (1987).
Kellman et al., Polym. Prepr. 22(2), 383 (1981).
Gerbi et al., J. Polym. Sci. Polym. Letters Ed. 23, 551 (1985).

Primary Examiner—Harold D. Anderson
Attorney, Agent, or Firm—Yuan Chao; Herb Burkard

[57] ABSTRACT

Fluorinated polyether compositions having reactive end gorups, such as

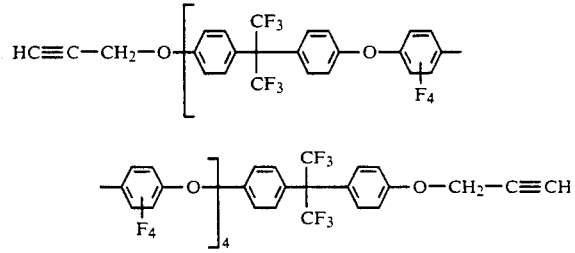

can be crosslinked to produce cured films useful as dielectrics for microelectronic applications. Other reactive end groups such as allyl, benzocyclobutyl, N-phenylmaleimido, alkynylphenyyl, styryl, allylphenyl, cyanophenyl, and triazenophenyl are also suitable.

6 Claims, 3 Drawing Sheets

FIG_1a

FIG_2

FIG_1b

FIG_3

FIG_3a

CROSSLINKABLE FLUORINATED AROMATIC ETHER COMPOSITION

CROSS-REFERENCE TO RELATED APPLICATIONS

This application is a continuation-in-part of applications nos. 07/583,899, filed Sep. 17, 1990; 07/583,900, filed Sep. 17, 1990; 07/510,353, filed Apr. 17, 1990; and 07/510,386, filed Apr. 17, 1990; the disclosures of each of which are incorporated herein by reference.

BACKGROUND OF THE INVENTION

This application relates to crosslinkable fluorinated aromatic ether compositions which are useful as dielectric and protective materials in microelectronic articles.

Polymer films and coatings are often used in the electronic industry as insulating materials and passivation layers, especially in integrated circuit devices such as multichip modules. Polymers having a low dielectric constant $\epsilon$ are preferred, because components insulated with them can be designed with higher circuit densities and can operate at higher speeds and with less signal broadening. The effect of $\epsilon$ on the performance of multilayer integrated circuit articles is discussed in "Microelectronics Packaging Handbook," Tummala et al. (eds.), pp. 687-692 (van Nostrand Reinhold); Watari et al., U.S. Pat. No. 4,744,007 (1988); and Budde et al., U.S. Pat. No. 4,732,843 (1988).

Polyimide is an insulator of choice for many electronic applications, because of its superior mechanical and thermal properties and its fabricability into thin films and coatings. However, polyimide has a relatively high $\epsilon$, a limitation accentuated by polyimide's tendency to absorb water (up to 3-4%) in humid environments. Water absorption causes $\epsilon$ to rise, compromising performance. One commercially available polyimide has an $\epsilon$ of about 3.2 at 0% relative humidity (% RH), which rises to about 3.8 at 60% RH. As noted by Denton et al. in *J. Electronic Mater,* 14(2), 119 (1985), polyimide moisture absorption can also adversely affect performance through increased insulator conductivity, loss of adhesion, or corrosion. Further, some polyimides are susceptible to hydrolysis and/or attack by solvents (often manifested by crazing or cracking upon exposure to a solvent).

It has been proposed, in Mercer, U.S. Pat. No. 4,835,197 (1989), to improve the solvent resistance of polyimide by curing with an acetylene, maleimide, or vinyl terminated curing agent. However, a polyimide so cured would still have the relatively high dielectric constant of polyimides and their tendency to absorb moisture.

Mercer, in copending commonly assigned application no. 07/447,771, filed Dec. 8, 1989, proposes using fluorinated polymers having a binaphthyl moiety as dielectric materials.

Polyquinoxalines, polyquinozalones, polybenzoxazoles, and copolymers thereof with polyimides have also been proposed as polymers for microelectronic applications by Labadie et al., in SAMPE J. vol. 25, pp. 18-22 (Nov./Dec. 1989).

Kellman et al., ACS Symp. Ser. 326, Phase Transfer Catalysis, p. 128 (1987) discloses the preparation of polyethers from diphenols and hexafluorobenzene and decafluorobiphenyl, although no particular utility is disclosed for the polymers so prepared. Similar disclosures are made in Kellman et al., Polym. Prepr. 22(2), 383 (1981) and Gerbi et al., J. Polym. Sci. Polym. Letters Ed. 23, 551 (1985).

This invention provides a fluorinated composition which is especially suitable in its crosslinked (or cured) state as a dielectric material in electronic articles.

SUMMARY OF THE INVENTION

This invention provides a composition which (a) comprises 3 to 30 repeat units of the formula wherein —W— is , or wherein each —A is independently —F, —Cl, —Br, —CF$_3$, —CH$_3$, —CH$_2$CH=CH$_2$, or —C$_6$H$_5$;

p is 0, 1, or 2;

—Z— is a direct bond, —C(CH$_3$)$_2$—, —C(CF$_3$)$_2$—, —O—, —S—, —SO$_2$—, —CO—, —P(C$_6$H$_5$)—, —C(CH$_3$)(C$_6$H$_5$), —C(C$_6$H$_5$)$_2$—, —(CF$_2$)$_{1-6}$—, wherein —Y— is —O— or a direct bond; and m is 0, 1, or 2;

each —X is independently —H, —Cl, —Br, —CF$_3$, —CH$_3$, —CH$_2$CH=CH$_2$, or —C$_6$H$_5$;

q is 0, 1, or 2; and n is 1 or 2;

and (b) is terminated at each end with a reactive end group —L which is —CH$_2$—CH=CH$_2$, —CH$_2$—C≡CH, where —$R_1$ is —H, $C_1$-$C_4$ alkyl, or —$C_6H_5$;
—$R_2$ is H, $C_1$-$C_4$ alkyl, —CN, or —$C_6H_5$;
—$R_3$ is —H, —$C_6H_5$, or —Si(CH$_3$)$_3$; and
—$R_4$ is $C_1$-$C_4$ alkyl or phenyl.

In a preferred embodiment, the composition has the formula wherein —L, —W—, —X, q, and n have their previously stated meanings and r is an integer from 3 to 30 inclusive.

In another preferred embodiment, the composition has the formula wherein —L, —W—, —X, q, and n have their previously stated meanings and r is an integer from 3 to 30 inclusive.

Preferably, —W— is corresponding to a composition having the repeat unit

The composition can be crosslinked for example by heating or irradiation to provide a solvent resistant material for electronic applications.

Another aspect of this invention provides an electronic article having a dielectric or protective material comprising a composition as described above, in its crosslinked form, particularly where the electronic article is a single or multichip module having a multilayer interconnect, an integrated circuit chip with a protective layer thereon, or a circuit board.

DESCRIPTION OF THE PREFERRED EMBODIMENTS

The compositions of this invention can be made by the condensation of a diphenol (A) with a fluorinated compound (B):

H—W—H +

(A)

(B)

-continued

In the equation above, —W—, —X, q, and n have the same meaning as defined earlier. Suitable diphenols (A) include 4,4'-(hexafluoroisopropylidene)diphenol, 4,4'-isopropylidene-di(2,6-dimethylphenol), 4,4'-(1-phenylethylidene) bisphenol, 4,4'-isopropylidenediphenol, 9,9'-bis(4-hydroxyphenyl)fluorene, 1,5-dihydroxynaphthalene, 1,4-dihydroxynaphthalene, 2,7-dihydroxynaphthalene, phenolphthalein, resorcinol, and 4,6-dichlororesorcinol, corresponding to —W—being:

or

Preferred diphenols (A) include 4,4'-(hexafluoroisopropylidene)diphenol, 9,9'-bis(4-hydroxyphenyl)fluorene, and 1,5-dihydroxynaphthalene.

Suitable fluorinated compounds (B) include hexafluorobenzene, decafluorobiphenyl, pentafluorobenzene, octafluorotoluene, 1,4-dibromotetrafluorobenzene, chloropentafluorobenzene, allylpentafluorobenzene, 2,2'3,3'4,4'5,5'-octafluorobiphenyl, and 2,2',3,3',5,5',6,6'-octafluorobiphenyl, corresponding to repeat units in which

Preferred fluorinated monomers include hexafluorobenzene and decafluorobiphenyl.

Generally, as initially synthesized and before curing, compositions of this invention are oligomers, and accordingly a slight stoichiometric excess of either diphenol (A) or difluoro compound (B) is used, to control the degree of oligomerization. Where an excess of the diphenol is used, the end groups —L can be introduced by using a halide capping agent containing the appropriate functionality or precursor thereof, such as allyl bromide or chloride, bromo- or chloromethyl styrene, propargyl bromide or chloride, and the like. Where an excess of the difluoro compound is used, the end groups —L can be introduced by using a phenolic capping agent containing the appropriate functionality or precursor thereof, such as allylphenol, N-hydroxyphenyl maleimide, cyanophenol, nitrophenol (the nitro group serving, e.g., as precursor for a triazeno group), and bromophenol (the bromo group serving, e.g., as precursor for an alkynyl group).

The uncured oligomers of this invention can be represented by the generic formula where the previously defined symbols retain their previously defined meanings and z is 0 or 1. The instance in which z is 0 corresponds to oligomers made with an excess of diphenol (A), i.e., having the formula The instance in which z is 1 corresponds to oligomers made with an excess of difluoro compound (B), i.e., having the formula A base such as an alkali metal carbonate, bicarbonate, or hydroxide is added to the reaction mixture to convert the phenoxy groups to the corresponding phenoxides. Sodium and potassium carbonate are preferred. A polar aprotic solvent, such as N,N-dimethylacetamide, N,N-dimethylformamide, or 1-methyl-2-pyrrolidinone is used. The use of such solvents is advantageous compared to other solvents such as nitrobenzene, which are more toxic and which are not soluble in water, thereby requiring work-up of the polymerization mixture in an organic solvent as opposed to water. The reaction is carried out at an elevated temperature, although such temperature should not be excessively high. A temperature between about 50° C. and about 160° C. is generally suitable, with a temperature between about 60° and about 120° C. being especially preferred. Reaction times are typically between about 10 and about 72 hours.

The degree of oligomerization is preferably between about 3 and about 30; more preferably between about 4 and about 25; and most preferably between about 4 and about 18. While the degree of oligomerization can be approximately predicted from the stoichiometric ratio of the starting reactants, it is preferable to confirm the actual degree of oligomerization by direct analytical measurements, such as integration of the $^1$H-NMR spectrum, on the oligomer itself.

Films or coatings of the oligomers can be formed by solution techniques such as spraying, spin coating, or casting, with spin coating being preferred. Preferred solvents include 2-ethoxyethyl ether, cyclohexanone, N,N-dimethylformamide, N,N-dimethylacetamide, methyl isobutyl ketone, 2-methoxyethyl ether, 5-methyl-2-hexanone, γ-butyrolactone, and mixtures thereof. Typically the coating thickness is between about 3 to about 15μ.

Additives can be used to enhance or impart particular target properties, as is conventionally known in the polymer art, including stabilizers, flame retardants, pigments, plasticizers, surfactants, crosslinking promoters, and the like. Compatible or non-compatible polymers can be blended in to give a desired property.

The oligomers can be cured to yield tough flexible films having high solvent resistance, as evidenced by their resistance to solvent induced crazing. Curing may be effected by simply heating a film of the oligomer, either in air or nitrogen, at temperatures between about 200° and about 450° C., preferably between about 300° and about 425° C., for a period between about 10 and about 60 min, preferably between about 15 and about 45 min. Alternatively, a peroxidic compound can be used to expedite curing. Suitable peroxides include 2,5-bis(-tertbutylperoxy)-2,5-dimethyl-3-hexyne, dicumyl peroxide, benzoyl peroxide, cumyl hydroperoxide, and the like. An intimate mixture of the composition and the peroxydic compound is heated to a temperature of between about 350° C. and about 425° C., preferably about 400° C., under nitrogen. Typically, the peroxydic compound is used in an amount of between about 5 and about 20% by weight, based on the combined amounts of composition and peroxydic compound, with about 10 wt. % being preferred. In addition, compositions of this invention can be crosslinked by ultraviolet (typically with an initiator present) or electron beam irradiation. Those skilled in the art will be able to readily determine empirically which particular curing conditions are preferable for which particular compositions, by reference to the conditions set forth above and to the specific examples hereinbelow.

We have found that where the composition is terminated with an allyl ($-CH_2CH=CH_2$) group bonded to an oxygen, curing by heating in air, as opposed to by heating in nitrogen (with or without added peroxide) is preferred. While not wishing to be bound by such theory, it is believed that in such compositions a Claisen rearrangement occurs, producing a phenol which interferes with the latter curing modes:

The cured compositions are useful as dielectrics for microelectronic articles, such as multilayer interconnects containing one or more chips, as adhesives, as protective coatings for microelectronic articles, and as substrates for circuit boards.

Figure 1A:
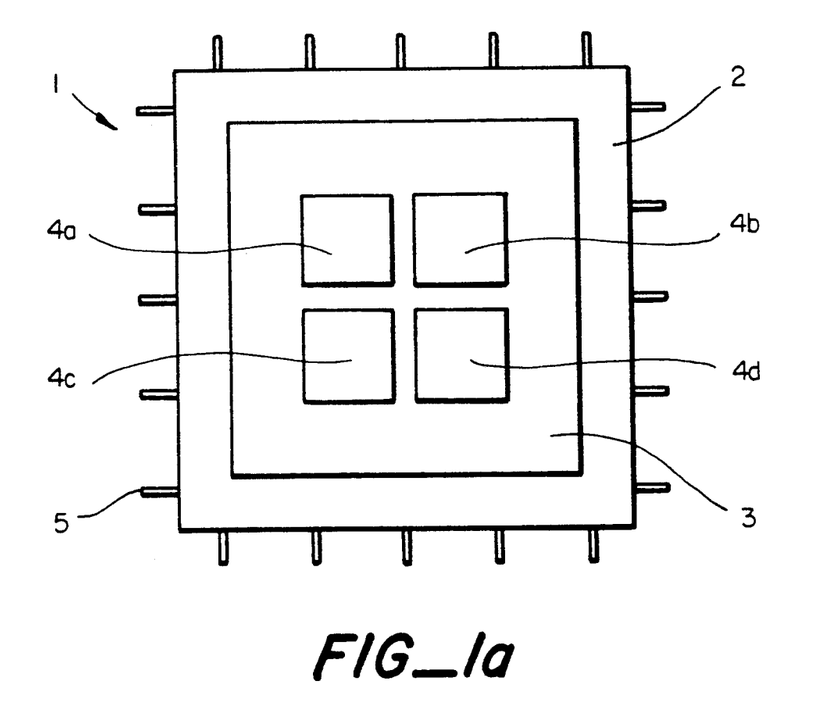
FIG. 1a depicts a multichip module having a multilayer interconnect in which the interlayer dielectric is a cured composition of this invention.

FIG. 1a shows a multichip module 1 having as a dielectric a cured oligomer film of this invention. Substrate 2, typically made of silicon, glass, or ceramic, supports high density multilayer interconnect 3 in which the dielectric material providing insulation between the various layers is cured fluorinated oligomer. On interconnect 3 are mounted semiconductor chips 4a-d, which are connected to each other by electrical conductors in interconnect 3. Substrate 1 may also contain electrical conductors, for example for power and ground. Lead frames 5 (only one labeled for simplicity) provide connections to external circuitry.

Figure 1B:
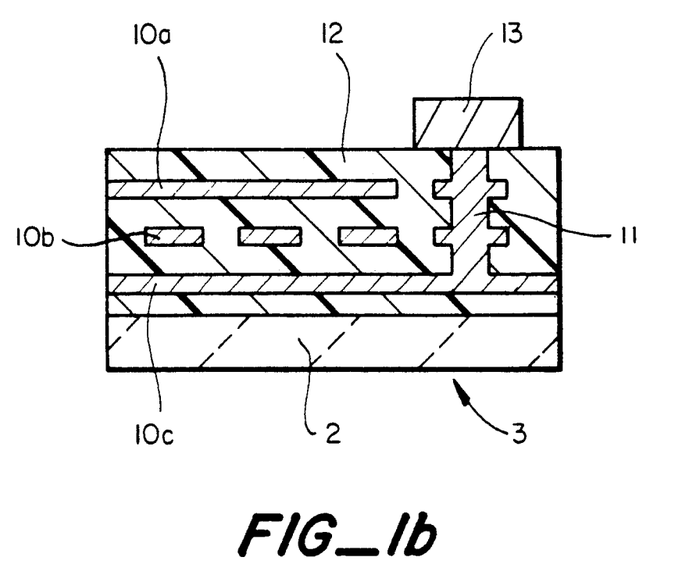
FIG. 1b shows in cross-section the multilayer interconnect.

FIG. 1b shows a partial cross-section of multilayer interconnect 3 supported on substrate 2. Layers of electrical connections 10a-c are separated from each other by cured fluorinated oligomer 12. Via 11 provides connections between the various layers as necessary. Interconnect 3 is connected to an integrated circuit chip (not shown) by bond pad 13. Via 11 is shown here in the stacked pillar design, although it is to be understood that other designs conventional in the art, such as the stair-stepped or nested via designs, can be used. Other multichip module designs in which the cured fluorinated oligomers can be used as interlayer dielectrics is disclosed in Balde, "Overview of Multichip Technology", Electronic Materials Handbook, vol. 1, Packaging ASM International, p. 297–312 (1989), the disclosure of which is incorporated herein by reference.

Figure 2:
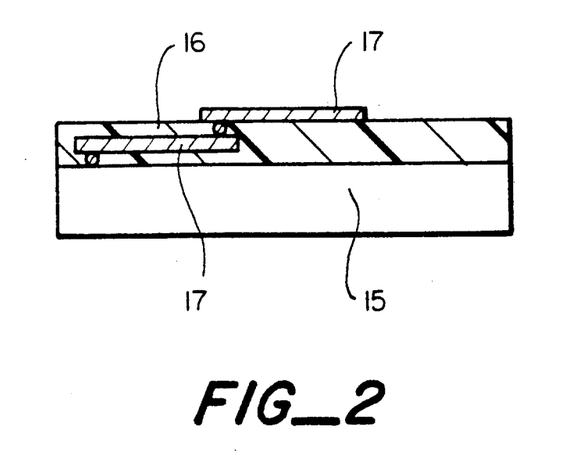
FIG. 2 shows in cross-section an integrated circuit chip having thereon a multilayer interconnect in which the interlayer dielectric is a cured composition of this invention.

Cured fluorinated oligomers can also be used as interlayer dielectrics in an interconnect associated with a single integrated circuit chip. FIG. 2 shows this embodiment in cross-section. Integrated circuit chip 15 has on a surface thereof plural layers 16 of cured fluorinated oligomer and multiple layers of metal conductors 17.

Figure 3:
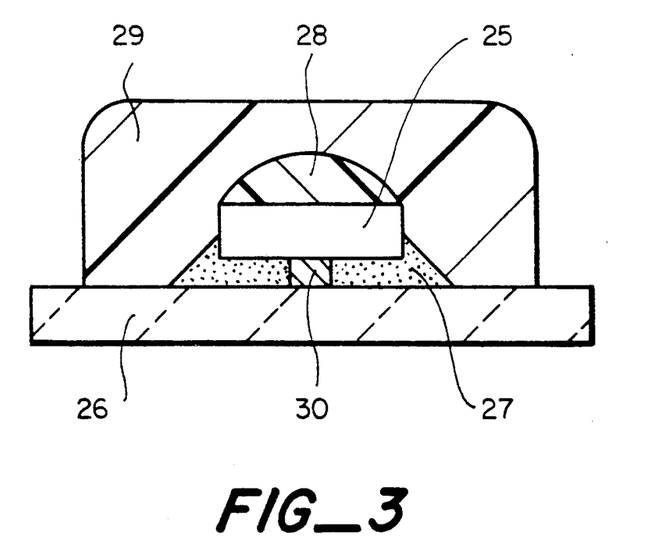
FIG. 3 shows in cross-section an integrated circuit chip protected by a coating of cured composition of this invention.

Cured fluorinated oligomers can further be used as protective coatings on integrated circuit chips, for protection against alpha particles. Semiconductor devices are susceptible to soft errors when alpha particles emitted from radioactive trace contaminants in the packaging or other nearby materials strike the active surface. FIG. 3 shows schematically an integrated circuit having a protective coating of cured fluorinated oligomer. Integrated circuit chip 25 is mounted on substrate 26 and held in place with the assistance of adhesive 27. A coating of cured fluorinated oligomer 28 provides an alpha particle protection layer for the active surface of chip 25. Optionally, additional protection is provided by encapsulant 29, made of for example epoxy or silicone. Conductor 30 provides connections between chip 25 and conductors (not shown) on substrate 26 and thence to external circuitry.

Figure 3A:
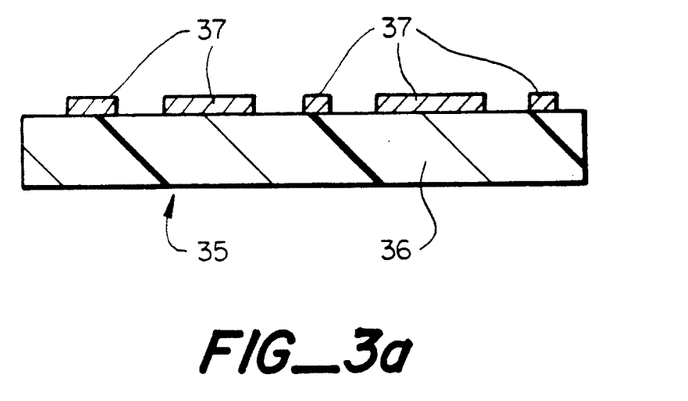
FIG. 3a shows in cross-section a circuit board in which the substrate is made from a cured composition of this invention.

Cured fluorinated oligomers can also be used as a substrate (dielectric material) in circuit boards (also referred to as printed wiring boards or PWB's). FIG. 3a shows in cross-section a circuit board 35 made of a substrate 36 having on a surface thereof a pattern of conductors 37. Substrate 36 is made of a cured fluorinated oligomer. Substrate 36 may be reinforced with woven nonconducting fibers, such as glass cloth. Although in FIG. 3a the circuit board is shown as single sided, those skilled in the art will appreciate that other constructions, such as double sided or multilayer, can also be made.

Dielectrics for electronic applications desirably contain low levels (generally less than 20 ppm) of ionic impurities. If a dielectric comprises a polymer is made by a synthetic route which requires the use of a transition metal reagent or catalyst, the effective removal of transition metal residues may be a difficult task. An advantage of the instant oligomers is that they can be made and subsequently cured by a route which does not involve transition metal species, and the potassium (or sodium) carbonate reagent and potassium (or sodium) fluoride by-product can be easily removed.

The practice of our invention can be further understood by reference to the following examples, which are provided for purposes of illustration and not of limitation.

EXAMPLE 1

This example describes the preparation of oligomer I:

To a 100 mL round bottom flask was added 5.06 g (0.0151) 4,4'-(hexafluoroisopropylidene)diphenol (bisphenol AF), 0.90 g (0.0061 mol) propargyl bromide, 33.2 g N,N-dimethylacetamide (DMAc), and 6.2 g potassium carbonate. The mixture was heated to 80° C. under nitrogen with stirring for 2 hours and 4.05 g (0.0121 mol) of decafluorobiphenyl was added. The mixture was heated at 80° C. under nitrogen with stirring for an additional 18 hours. The solution was allowed to cool to room temperature and poured into water to precipitate the oligomer. Oligomer I was collected by filtration, washed with water, and dried to yield a white powder. The degree of oligomerization was determined to be about 4 by $^1$H-NMR.

Two grams of the oligomer were dissolved in 4.5 g of cyclohexanone, spin coated onto glass, and dried 15 min. at 100° C., 15 min. at 200° C., and 15 min at 350° C. to yield an amber film. The film had a dielectric constant of 2.55 and a moisture absorption of 0.15%. A sample of the film was immersed in cyclohexanone and did not appear to swell or dissolve.

EXAMPLE 2

This example describes the preparation of oligomer II:

To a 250 mL round bottom flask was added 0.97 g (0.0089 mol) of 4-aminophenol, 0.87 g (0.0089 mol) maleic anhydride, and 100 mL of DMAc. The mixture was heated to 150° C. for 1.5 hours to prepare 0.0089 mol of N-(4-hydroxyphenyl)maleimide in situ. The reaction mixture was allowed to cool to room temperature and 11.88 g (0.0356 mol) of decafluorobiphenyl, 10.46 g (0.0311 mol) of Bisphenol AF, and 11.0 g potassium carbonate was added. The mixture was heated to 70° C. for 18 hours under nitrogen with stirring. The mixture was allowed to cool to room temperature and poured into water to precipitate the oligomer. The oligomer was collected by filtration, washed with water, and dried to yield a reddish, brown solid. A degree of oligomerization of about 7 was inferred from the stoichiometry of the reactants. The presence of the terminal maleimide groups was confirmed by IR analysis (C=O, 1830 cm$^{-1}$).

One gram of the maleimide terminated oligomer was dissolved in 3 grams of a 1/1 mixture of cyclohexanone and γ-butyrolactone, spin coated onto a glass substrate, and dried 15 min. at 100° C., 15 min. at 200° C., and 30 min. at 300° C. to yield a flexible amber film. The cured product had a $T_g$ of 210° C. (DSC), a dielectric constant of 2.55 at 0% relative humidity (RH), a dielectric constant of 2.67 at 50% RH, and a gel content of 89.9%.

EXAMPLE 3

This example describes the preparation of oligomer IIIa via the corresponding dibromide IIIb:

IIIa —Q=—C≡C—Si(CH$_3$)$_3$
IIIb —Q=—Br

To a 100 mL round bottom flask was added 6.00 g (0.01786) of Bisphenol AF, 0.88 g (0.0051 mol) of 3-bromophenol, 6.82 g (0.0204 mol) of decafluorobiphenyl, 38.2 g of DMAc, and 6.9 g of potassium carbonate. The mixture was heated to 80° C. under nitrogen with stirring for 18 hours. The solution was allowed to cool to room temperature and poured into water to precipitate the oligomer. The oligomer was collected by filtration, washed with water, and dried to yield oligomer IIIb as a white powder.

To a 100 mL round bottom flask was added 2.0 grams of oligomer IIIb, 12 g of DMAc, 2 g of triethylamine, 0.75 g of trimethylsilylacetylene, 0.15 g of triphenylphosphine, 0.1 g of copper (I) iodide, and 0.15 g of bis(triphenylphosphine) palladium (II) chloride. The mixture was heated to 40° C. under nitrogen with stirring for 24 hr. The mixture was poured into water to precipitate oligomer IIIa, washed once with water, digested for 15 min. in 25 mL of ethanol, and dried to yield a brown powder. The degree of oligomerization was determined to be about 7 by gel permeation chromatography (GPC). The powder was heated to 300° C. for 30 min. to yield a crosslinked polymer having 93.7% gel.

EXAMPLE 4

This example describes the preparation of oligomer IV:

To a 100 mL round bottom flask was added 5.00 g (0.0247 mol) of chloropentafluorobenzene, 0.74 g (0.0055 mol) of 2-allylphenol, 7.37 g (0.0219 mol) of Bisphenol AF, 35 g of DMAc, and 7.0 g of potassium carbonate. The mixture was heated to 90° C. under nitrogen with stirring for 24 hours. The temperature was raised to 145° C. and the mixture was stirred for an additional 18 hours under nitrogen. The solution was allowed to cool to room temperature and poured into water to precipitate the oligomer. The oligomer was collected by filtration, washed with water, and dried to yield oligomer IV as a white powder. The degree of oligomerization was determined to be about 8 by $^1$H-NMR. $T_g$ (uncured) = 131° C., $T_g$ (cured 30 min/350° C.) = 183° C. (with gel content of 87.8%).

EXAMPLE 5

This example describes the preparation of co-oligomer V:

(0.02489 mol) of 1,5-dihydroxynaphthalene was added. The mixture was heated to 120° C. with stirring under nitrogen for an additional 17 hours. The mixture was allowed to cool to room temperature and poured into a blender containing 450 mL of water to precipitate the oligomer. The oligomer was collected by filtration, washed three times in 400 mL of water, and dried to yield an off-white powder. While as a matter of convenience the structure in formula V is depicted as that of a 2:1 alternating co-oligomer, it is believed that in fact the oligomer is random.

To a 250 mL plastic bottle was added 27 g of the allyl-terminated co-oligomer, 3.0 g of dicumyl peroxide, 36.5 g of cyclohexanone, and 36.5 g of γ-butyrolactone. The mixture was dissolved with stirring at room temperature. Five mL of the solution was spin coated on to a glass substrate and cured 10 min. at 100° C. in air, 15 min. at 200° C. in air, and 30 min. at 300° C. in nitrogen to yield an amber film. The film had a dielectric constant of 2.65 at 0% RH and a dielectric constant of 2.70 at 53% RH.

Five mL of the oligomer solution was spin coated on to a silicon substrate and cured 10 min. at 100° C. in air, 15 min. at 200° C. in air, and 30 min. at 400° C. in nitrogen to yield a film about 8 microns thick. Four additional coatings were applied and cured as described above to yield a coating 40 microns thick. Exposure of the coating to xylene, cyclohexanone, γ-butyrolactone, or mixtures of these solvents did not cause solvent induced stress crazing in the film. A similar 40 micron thick coating prepared with a comparison oligomer having the same repeat unit but not containing allyl end groups and subjected to similar conditions solvent stress crazed when exposed to these solvents.

Oligomer V was used to fabricate an electronic inter-

V

To a 500 mL round bottom flask was added 25.00 g (0.07485 mol) of decafluorobiphenyl, 1.00 g (0.007485 mol) of 2-allyphenol, 16.18 g (0.04622 mol) of 9,9-bis(4-hydroxyphenyl)fluorene), 20 g potassium carbonate, and 200 g of DMAc. The mixture was heated to 110° C. with stirring under nitrogen for 4 hours. Then 3.98 g connect device by the following procedure: A solution of 20 of oligomer V and 2 g of dicumyl peroxide in a 1:1 mixture of cyclohexanone and γ-butyrolactone was spin coated onto a silicon substrate. The coating was dried at 150° C. for 15 min in air and cured in a nitrogen oven ramped from room temperature to 400° C. in one hour. The substrate wa held at 400° C. for 1 hr and cooled to ambient temperature by ramping down over a period of 2 hr. This procedure was repeated four times to yield a final oligomer layer of thickness 20 microns.

The oligomer layer was blanket sputtered with chromium (0.05 micron), nickel (1.0 micron), and gold (1.0 micron) in sequence. Gold was plated up to a total thickness of 6.0 microns. The metal layer was patterned using standard photolithographic techniques and wet etched to form metal bonding pads for wire bonding. Wire bonds were made to these bonding pads with 30 micron diameter gold wire using a standard thermosonic wire bonder. Pull tests were performed on these wire bonds with good results (i.e., failure was due to wire break and not due to bond or bond pad failure). Typical pull test values were greater than 15 grams.

EXAMPLE 6

A series of oligomers VIa-d with degrees of oligomerization ranging from about 4 to about 25 was prepared:

VIa s = 4
VIb s = 9
VIc s = 17
VId s = 25

The procedure for VIa is representative: To a 250 mL, round-bottom flask fitted with a magnetic stirrer and a condenser were added 5 grams (0.015 moles) of decafluorobiphenyl, 3.90 grams (0.0116 moles) of bisphenol AF, 0.8 grams (0.006 moles) of 2-allylphenol, and 65 grams of DMAc. After the solids had dissolved 5.0 grams (0.036 moles) of anhydrous potassium carbonate was added to the mixture. The reaction vessel was purged with nitrogen. The mixture was heated to approximately 85° C. using an oil bath and stirred for 24 hours. The mixture was allowed to cool to room temperature and then was poured into a 250 mL separatory funnel. Approximately 30 mL of methylene chloride was added to the mixture in the funnel. The mixture in the funnel was washed three times with approximately 35 mL of deionized water. The remaining organic solution was dried with magnesium sulfate and filtered into a clean, dry, 100 mL, round-bottomed flask. The methylene chloride was removed by rotary evaporation. This left a thick solution in the flask. Deionized water was added to this thick solution until it turned into a globule of white material. This globule was then chopped in a blender filled with approximately 150 mL of deionized water. The precipitate was allowed to digest in the water for approximately 10 minutes and then it was filtered with a Buchner funnel. The precipitate was washed three times in the funnel with 100 mL of deionized water. After the last wash, the precipitate was dried under vacuum at 80° C. for approximately 1.5 hours. This procedure yielded VIa as a white powder.

The structure of VIa was confirmed by $^1$H-NMR. This was done by comparing the area under the peaks at 6.05 ppm, 5.15 ppm, and 3.6 ppm, corresponding to the allyl protons, to the area under the peaks from 6.7 ppm to 7.6 ppm, corresponding to the aromatic protons. The degree of oligomerization was determined to be about 4. The curing and properties of oligomers VIa-d is described below.

EXAMPLE 7

This example describes the preparation of oligomer VII:

To a 250 mL, round-bottom flask fitted with a magnetic stirrer and a condenser was added 17 grams (0.0505 moles) of bisphenol AF, 1.2 grams (0.0099 moles) of allyl bromide, and 87 grams of DMAc. After the solids had dissolved 18.0 grams (0.1304 moles) of anhydrous potassium carbonate was added to the mixture. The reaction vessel was purged with nitrogen. The mixture was heated to approximately 65° C. using an oil bath and allowed to stir for 24 hours. Then 15 grams (0.0449 moles) of decafluorobiphenyl was added to the mixture. The mixture was again purged with nitrogen and allowed to stir for another 24 hours at 65° C. The product was isolated by allowing the mixture to cool to room temperature and pouring it into a blender filled with approximately 300 mL of deionized water. The precipitate was allowed to digest in the water for approximately 10 minutes and then it was filtered with a Buchner funnel. This digestion procedure was repeated three more times. After the last digestion, the precipitate was dried under vacuum at 80° C. for approximately 2 hours. This procedure yielded oligomer VII as a white powder.

The structure of oligomer VII was confirmed by 1H-NMR. This was done by comparing the area under the peaks at 6.05 ppm, 5.35 ppm, and 4.55 ppm, corresponding to the allyl protons, to the area under the peaks from 6.7 ppm to 7.6 ppm, corresponding to the aromatic protons. The degree of oligomerization was determined to be about 10. The curing and the properties of oligomer VII is described below.

EXAMPLE 8

This example describes the preparation of oligomer VIII:

in the water for approximately 10 minutes and then it was filtered with a Buchner funnel. This digestion procedure was repeated three more times. After the last digestion, the precipitate was dried under vacuum at 80° C. for approximately 2 hours. This procedure yielded oligomer VIII as a white powder.

The structure of oligomer VIII was confirmed by 1H-NMR. This was done by comparing the area under the peaks at 5.75 ppm, and 5.25 ppm, corresponding to the vinyl protons, to the area under the peaks from 6.5 ppm to 7.9 ppm, corresponding to the aromatic protons. The degree of oligomerization was determined to be about 8. the curing and properties of oligomer VIII is described below.

To a 250 mL, round-bottom flask was added 15 grams (0.044 moles) of 9,9'-(hydroxyphenyl)-fluorene, 1.5 grams (0.0098 moles) of chloromethylstyrene, supplied as a mixture of 70% of the meta-isomer and 30% of the para-isomer, and 85 grams of DMAc. The reaction vessel was fitted with a magnetic stirrer and a condenser. After the solids had dissolved 16.0 grams (0.1159 moles) of anhydrous potassium carbonate was added to the mixture. The reaction vessel was purged with nitrogen. The mixture was heated to approximately 90° C. using an oil bath and allowed to stir for 24 hours. Then 13.06 grams (0.0391 moles) of decafluorobiphenyl was added to the mixture. The mixture was again purged with nitrogen and allowed to stir for another 24 hours at 90° C. The product was isolated by allowing the mixture to cool to room temperature and pouring it into a blender filled with about 300 mL of deionized water. The precipitate was allowed to digest

EXAMPLE 9

This example describes the preparation of a comparative oligomer IX not according to this invention:

To a 250 mL, round-bottom flask was added 15 grams (0.0449 moles) of decafluorobiphenyl, 13.44 grams (0.04 moles) of bisphenol AF, 0.94 grams (0.01 moles) of phenol, and 90 grams of DMAc. The reaction vessel was fitted with a magnetic stirrer and a condenser. After the solids had dissolved 20 grams (0.145 moles) of anhydrous potassium carbonate was added to the mixture. The reaction vessel was purged with nitrogen. The mixture was heated to approximately 85° C. using an oil bath and allowed to stir for 24 hours. The product was isolated by allowing the mixture to cool to room temperature and pouring it into a beaker filled with approx- imately 300 mL of deionized water that was being stirred. The precipitate was allowed to digest in the water for approximately 10 minutes and then it was filtered with a Buchner funnel. The precipitate was washed three times in the funnel with 100 mL of deionized water. After the last wash, the precipitate was dried at 100° C. for about 1.5 hours. This procedure yielded oliogomer IX a white powder. The degree of oligomerization of oligomer IX was calculated to be about 8 based on the stoichiometric ratio of the starting materials. Gel permeation chromatography supports this assumption, because the chromatogram obtained for IX was essentially the same as that for oligomer VIb.

Since oligomer IX does not have an end group with reactive functionalities, it was expected that it would not be as readily crosslinked as the oligomers of this invention. It was used as a control sample for the curing experiments described below.

EXAMPLE 10

This example describes the preparation of oligomer X:

prepared for peroxide curing, 2,5-bis(tert-butylperoxy)2,5-dimethyl-3-hexyne (BPDH)

was added at a ratio of 9:1 (w:w) oligomer to peroxide. This resulted in a solution with a total of 37.4 wt % solids. These solutions were then cast onto a glass plate and cured. Two different cure methods were used. In the first method, samples were cured in air for 15 minutes at 100° C., 15 minutes at 200° C., and 30 minutes at 350° C. In the second method, samples were dried in air for 15 minutes at 100° C. and 10 minutes at 200° C. The samples were then placed in a nitrogen purged oven with the temperature heating from room temperature to 300° C. in approximately 35-40 minutes. The samples were held at 300° C. for 30 minutes, then allowed to cool from 300° C. to room temperature in 1-1.5 hours. These samples were then extracted with boiling DMAc for 24 hours. The results are provided in Table 1.

To a 250 mL, round-bottom flask was added 15 grams (0.0449 moles) of decafluorobiphenyl 15.26 g (0.0454 mol) of Bisphenol AF, 1.19 grams (0.001 moles) of 4-cyanophenol, and 85 grams of DMAc. The reaction vessel was fitted with a magnetic stirrer and a condenser. After the solids had dissolved 18.5 grams (0.134 moles) of anhydrous potassium carbonate was added to the mixture. The reaction vessel was purged with nitrogen. The mixture was heated to approximately 65° C. using an oil bath and allowed to stir for 18 hours. Then 13.41 grams (0.0431 moles) of bisphenol AF was added to the mixture. The mixture was again purged with nitrogen and allowed to stir for another 18 hours at 65° C. The product was isolated by allowing the mixture to cool to room temperature and pouring it into a blender filled with approximately 300 mL of deionized water. The precipitate was allowed to digest in the water for about 10 minutes and then it was filtered with a Buchner funnel. This digestion procedure was repeated three more times. After the last digestion, the precipitate was dried under vacuum at 80° C. for approximately 2 hours. This procedure yielded a white powder.

The structure of oligomer X was confirmed by $^1$H-NMR. This was done by comparing the area under the peaks at 7.68 ppm, corresponding to the protons ortho to the cyano group, to the area under the peaks from 6.7 ppm to 7.8 ppm, corresponding to all of the aromatic protons. The degree of oligomerization was determined to be about 7 by $^1$H-NMR. The curing and properties of oligomer X are described below.

EXAMPLE 11

The following general extraction procedure was used for determination of gel content of oligomers cured under various conditions: The oligomer was dissolved in cyclohexanone at 35 wt % oligomer. To samples

TABLE 1

| | Gel Content of Oligomers | | |
|---|---|---|---|
| | Gel Content (%) | | |
| Oligomer | Cured in air (30 min/350° C.) | Cured in N$_2$ (with BPDH) | Cured in N$_2$ (without BPDH) |
| VIa | 82.4 | 0.0 | 0.0 |
| VIb | 90.7 | 61.3 | 0.0 |
| VIc | 96.8 | 67.3 | 42.0 |
| VId | 93.8 | 65.7 | 23.8 |
| VII | 87.6 | 0.0 | 0.0 |
| VIII | 97.8 | 92.2 | 94.7 |
| IX | 0.0 | 0.0 | 0.0 |
| X | 83.9$^a$ | 60.4$^b$ | — |

$^a$120 min/400° C.
$^b$120 min/300° C.

The following general procedure was used to determine the glass transition temperatures (T$_g$) of oligomers: Samples of the uncured oligomers as well as the cured oligomers were analyzed by Differential Scanning Calorimetry (DSC). The samples were prepared by sealing approximately 5-10 mg of the material into an aluminum pan. The samples were then heated from 50° C. to 350° C. at 10° C./minute in nitrogen. The results are provided in Table 2.

TABLE 2

| | Glass Transition Temperature of oligomers | | | |
|---|---|---|---|---|
| | Glass Transition Temperature (°C.) | | | |
| Oligomer | Uncured | Cured in air (30 min/ 350° C.) | Cured in N$_2$ (with BPDH) | Cured in N$_2$ (without BPDH) |
| VIa | 100 | 191 | 145 | 123 |
| VIb | 138 | 201 | 173 | 149 |
| VIc | 149 | 198 | 178 | 159 |
| VId | 137 | 204 | 180 | 173 |
| VII | 112 | 190 | 154 | 138 |
| VIII | 189 | 312 | 272 | 253 |
| IX | 138 | 152 | 150 | 149 |

TABLE 2-continued

Glass Transition Temperature of oligomers

| Oligomer | Uncured | Cured in air (30 min/ 350° C.) | Cured in $N_2$ (with BPDH) | Cured in $N_2$ (without BPDH) |
|---|---|---|---|---|
| X | 123 | 177[a] | 171[b] | — |

[a] 120 min/400° C.
[b] 120 min/300° C.

EXAMPLE 12

This example describes the preparation of oligomers XIIIa-b from the corresponding dinitro oligomers XIa-b and diamino oligomers XIIa-b:

XIa   —P = —NO$_2$ and t = 6
XIb   —P = —NO$_2$ and t = 20
XIIa  —P = —NH$_2$ and t = 6
XIIb  —P = —NH$_2$ and t = 20
XIIIa —P = —N=N—N(CH$_3$)$_2$ and t = 6
XIIIb —P = —N=N—N(CH$_3$)$_2$ and t = 20

The procedure for oligomer XIIIa is representative: To a 250 mL round bottom flask equipped with a mechanical stirrer, thermometer, and nitrogen inlet was added 2.78 g (19.98 mmol) of 4-nitrophenol, 16.72 g (50.04 mmol) of decafluorobiphenyl, and 13.54 g (40.01 mmol) of 9,9-bis(4-hydroxyphenyl)fluorene, 16.0 g (115.77 mmol) of potassium carbonate, and 120 mL DMAc. The mixture was stirred under nitrogen at 80° C. for 24 hr. Afterwards the mixture was cooled to room temperature and poured into 1500 mL of water to precipitate oligomer XIa. The precipitate was filtered, washed with 2 L of water and then 500 mL of methanol, suction air dried, and vacuum dried at about 60° C. overnight to yield 22.3 g (ca. 67%) dinitro oligomer XIa as an off-white powder. The degree of oligomerization was determined to be about 6 by $^1$H-NMR integration (CDCl$_3$): δ 6.56–8.00 (m, Ar-H), 8.31 (d, H alpha to NO$_2$). IR (thin film on NaCl): 1600, 1490, 1350, 1215, 1178, and 1075 cm$^{-1}$.

To a solution of 16.42 g oligomer XIa in a mixture of 100 mL tetrahydrofuran (THF) and 30 mL anhydrous ethanol, 2.0 g platinum on activated charcoal catalyst (0.5% Pt) was added. Hydrogenation was carried out in a Parr Instrument 3911 hydrogenator under 60 psi of hydrogen pressure for 24 hr at ambient temperature. At the end of the reaction period, the catalyst was filtered off and the solvent removed under reduced pressure at about 35° C. The residue was redissolved in 40 mL of THF and poured slowly into 1000 mL of rapidly stirred water to precipitate diamino oligomer XIIa. The product was washed with 1 L water, suction air dried, and vacuum dried at about 50° C. overnight to yield 15.80 g (ca. 97%) oligomer XIIa as a light yellow powder. IR (thin film on NaCl): 1600, 1490, 1250, 1178, and 1075 cm$^{-1}$. $^1$H-NMR (CDCl$_3$): δ 6.56–8.00 (m,Ar-H).

To a solution of 10.0 g (ca. 3 mmol) of oligomer XIIa in 500 mL THF in a 500 mL round bottom flask equipped with a mechanical stirrer, a thermometer, and an addition funnel, a solution of 5.0 mL (60 mmol) 12N hydrochloric acid in 20 mL water was added slowly. The resulting mixture was chilled to −15° C. with continuous stirring. A solution of 1.0 g (14.49 mmol) of sodium nitrite in 20 mL water was added over a period of 20 min with vigorous stirring. During the addition, the temperature of the reaction mixture did not exceed −10° C. The reaction mixture was stirred at below −7° C. for an additional 60 min. Then, a solution of 6.5 g (61.33 mmol) of sodium carbonate in 20 mL of water was added, followed by a solution of 2.5 g (30.7 mmol) of dimethylamine hydrochloride in 10 mL water. The final mixture was stirred at 0° C. for 60 min. At the end of the reaction, one-third of the organic solvent was removed under reduced pressure at about 35° C. The remaining mixture was added to 1 L water with vigorous stirring to precipitate oligomer XIIIa. The product was washed with 2 L of water, suction air dried, and vacuum dried at about 55° C. overnight to yield 9.3 g (ca. 84%) oligomer XIIIa as a dark orange, fluffy powder. IR (thin film on NaCl): 1600, 1490, 1215, 1178, and 1075 cm$^{-1}$. $^1$H-NMR (CDCl$_3$) δ 3.38 (s, —CH$_3$), 6.56–8.00 (m, Ar-H).

Oligomer XIIIb was prepared by a similar procedure, starting from 8.00 g (23.94 mmol) decafluorobiphenyl, 7.79 g (23.02 mmol) 9,9-bis(4-hydroxyphenyl)fluorene, and 0.51 g (3.68 mmol) 4-nitrophenol. The degree of oligomerization was estimated as about 20 by $^1$H-NMR integration of the nitro oligomer XIb. Oligomer XIIIb was obtained as a flaky, light yellow powder. IR (thin film on NaCl): 1600, 1490, 1215, 1178, and 1075 cm$^{-1}$. $^1$H-NMR (CDCl$_3$): 3.38 (s, —CH$_3$), 6.56–8.00 (m, Ar-H).

Free standing films (10–30 μm thick) of oligomers XIIIa and XIIIb were obtained by spin-casting an aliquot of oligomer solution in a mixture of cyclohexanone/γ-butyrolactone (1:1 v/v) onto a 4"×4" (ca. 10 cm×10 cm) glass plate. The coated plates were soft baked from 25° C. to 200° C. at 10° C./min under nitrogen, and cured at 300° C. for 60 min under nitrogen, and subsequently soaked in 80° C. water to release the films. The various properties of oligomers XIa-b, XIIa-b, and XIIIa-b are summarized in Table 3, along with comparative results for fluorinated aryl ether polymer XIV, having the same repeat unit as oligomers XIIIa–b but without their reactive end groups.

If an azo terminated oligomer instead of a triazene terminated one is desired, the diazonium salt from the diazotization of amine terminated oligomers XIIa and XIIb can be trapped with an organo zinc or magnesium halide. For a more detailed description of the use of the latter reagents in trapping diazonium salts, see Wolf et al., U.S. Pat. No. 4,946,949 (1990), the disclosure of which is incorporated by reference.

oil bath with stirring. After the reactants had dissolved, 7.0 g of potassium carbonate was added. The mixture was heated at 90° C. for an additional 17 hr under nitrogen. The mixture was allowed to cool to room temperature and was poured into water to precipitate oligomer XV. The oligomer was collected by filtration, washed with ethanol and water, and dried to yield the oligomer as a white powder. The average degree of oligomerization of the oligomer was determined to be 9 by $^1$H-NMR. Two grams of the oligomer were dissolved in 5 grams of DMAc and spin coated on to a glass substrate

TABLE 3

Properties of Oligomers XI–XIII

| Property | XIV | XIa | XIIa | XIIIa | XIb | XIIb | XIIIb |
|---|---|---|---|---|---|---|---|
| Deg. oligomerization | | | | | | | |
| Calc.[a] | | 4 | | | 25 | | |
| Exp.[b] | | 6 | | | 20 | | |
| Stress cracking[c] | No | Yes | Yes | Yes | Yes | No | No |
| Solvent crazing | Yes | | | No | | | No |
| Gel content of cured film (%)[d] | 0.0 | | | 97.6 | | | 93.1 |
| Tg (cured film) (°C.)[e] | 258 | | | 302 | | | 288 |
| Dielectric const.[f] | | | | | | | |
| at 0% RH | 2.680 | | | 2.763 | | | 2.720 |
| at 60% RH | 2.754 | | | 2.895 | | | 2.841 |
| Molecular wt | | | | | | | |
| $M_n$[g] | 20,000 | 2,800 | 3,196 | 3,309 | 5,310 | 6,329 | 5,150 |
| $M_p$[h] | 60,250 | 3,544 | 2,436 | 2,823 | 16,210 | 39,550 | 39,550 |

[a]Calculated from stoichiometric ratio of starting materials
[b]From $^1$H-NMR integration of hydrogens adjacent to nitro groups
[c]Cracking of film after cooling down to room temperature in air
[d]After 24 hr continuous extraction in boiling DMAc of cured film
[e]DSC at 10° C./min
[f]At 10 kHz
[g]From GPC using four HP 10μ PL gel columns (500/10$^2$/10$^3$/10$^4$ Å pore sizes) with THF eluent and polystyrene calibration standards
[h]Molecular weight at peak maximum

EXAMPLE 13

This example describes the preparation of oligomer XV:

and cured 15 min. at 100° C., 15 min. at 200° C., and 30 min. at 400° C. in air to yield an amber film having a gel content of 86%. Infrared analysis (C=O) 1780 cm$^{-1}$.

XV

To a 100 mL round bottom flask was added 8.25 g (0.0247 mol) of decafluorobiphenyl, 6.97 g (0.0219 mol) of phenolphthalein, 0.74 g (0.0055 mol) of 2-allylphenol, and 35 g DMAc. The mixture was heated to 90° C. in an

EXAMPLE 14

This example describes the preparation of oligomer XVI:

XVI

To a 500 mL round bottom flask was added 25.00 g (0.07485 mol) of decafluorobiphenyl, 1.00 g (0.007485 mol) of 2-allylphenol, 16.18 g (0.04622 mol) of 9,9-bis(4-hydroxyphenyl)fluorene), 20 g potassium carbonate, and 200 g of DMAc. The mixture was heated to 110° C. with stirring under nitrogen for 4 hr. Then 3.98 g (0.0249 mol) of 2,6-dihydroxynaphthalene was added. The mixture was heated to 130° C. with stirring under nitrogen for an additional 17 hours. The mixture was allowed to cool to room temperature and poured into a blender containing 450 mL of water to precipitate the oligomer. The oligomer was collected by filtration, washed three times in 400 mL of water, and dried to yield an off-white powder.

To a 250 mL plastic bottle was added 27 g of oligomer XVI, 3.0 g of dicumyl peroxide, 36.5 g of cyclohexanone, and 36.5 g of γ-butyrolactone. The mixture was dissolved with stirring at room temperature. Five mL of the solution was spin coated onto a glass substrate and cured 10 min. at 100° C. in air, 15 min. at 200° C. in air, and 30 min. at 300° C. in nitrogen to yield an amber film. Exposure of the film to γ-butyrolactone or cylohexanone did not cause solvent induced stress crazing. The film had a dielectric constant of 2.65 at 0% RH. The structure of the oligomer (average DP of 9) was confirmed by $^1$H-NMR. The oligomer is depicted as alternating as a matter of convenience in drawing the structural formula; in actuality, it is believed to be random.

EXAMPLE 15

This example describes the preparation of oligomer XVII and its curing with UV radiation.

XVII

To a 250 mL, round-bottom flask were added 15 g (0.0446 moles) of 4,4'-(hexafluoroisopropylidene)diphenol, 2.71 g (0.0179 moles) of alpha-chloromethylstyrene, supplied as a mixture of 70% of the meta-isomer and 30% of the para-isomer, and 70 g of DMAc. The reaction vessel was fitted with a magnetic stirrer and a condenser. After the solids had dissolved 18.5 g (0.1338 moles) of anhydrous potassium carbonate were added to the mixture. The reaction vessel was purged with nitrogen. The mixture was heated to about 70° C. using an oil bath and allowed to stir for 18 hr. Then 11.92 grams (0.0357 moles) of decafluorobiphenyl were added to the mixture. The mixture was again purged with nitrogen and allowed to stir for another 18 hours at 70° C. The product was isolated by allowing the mixture to cool to room temperature and pouring it into a blender filled with approximately 350 mL of deionized water. The precipitate was allowed to digest in the water for about 10 min and then it was filtered with a Buchner funnel. This digestion procedure was repeated three more times. After the last digestion, the precipitate was dried under vacuum at room temperature. This procedure yielded oligomer XVII as a white powder. Its structure was confirmed by $^1$H-NMR. This was done by comparing the area under the peaks at 6.7 ppm, 5.75 ppm, and 5.25 ppm, corresponding to the vinyl protons and the area under the peaks at 5.05 ppm, corresponding to the methylene protons, to the area under the peaks from 6.8 ppm to 7.6 ppm, corresponding to the aromatic protons. The degree of oligomerization was determined to be about 5. Oligomer XVII had an $M_n$ and an $M_w$ of 2740 and 6598, respectively, as determined by GPC with calibrations using polystyrene standards.

Oligomer XVII (3.33 grams) were dissolved in 5 grams of cyclohexanone resulting in a solution containing 40 wt % solids. To this solution, 0.175 grams of Darocur ™ 1173 (EM Industries Inc.) UV initiator was added resulting in a solution containing 41.2 wt % solids. This final solution was then spun cast onto a glass plate and dried at 130° C. for 15 minutes. The dried sample was then exposed to intense UV radiation for 60 seconds. The cured film was tough and flexible. The cured sample was then released from the glass plate and placed in a Sohxlet extractor. The sample was then extracted with refluxing DMAc for 24 hours to determine its gel content, which was 85.6%.

What is claimed is:

1. A composition (a) comprising 3 to 30 repeat units of the formula wherein —W— is wherein each —A— is independently —F, —Cl, —Br, —CF₃, —CH₃, —CH₂CH═CH₂, or —C₆H₅;
p is 0, 1, or 2;
—Z— is a direct bond, or Z is —C(CH₃)₂—, —C(CF₃)₂—, —O—, —S—, —SO₂—, —CO—, —P(C₆H₅)—, —C(CH₃)(C₆H₅), —C(C₆H₅)₂—, —(CF₂)₁₋₆—, wherein —Y— is —O— or Y is a direct bond; and m is 0, 1, or 2;
each —X is independently —H, —Cl, —Br, —CF₃, —CH₃, —CH₂CH═CH₂, or —C₆H₅;
q is 0, 1, or 2;
and n is 1 or 2;
and (b) being terminated at each end with a reactive end group —L which is —CH₂—CH═CH₂, —CH₂—C≡CH, where —R₁ is —H, C₁-C₄ alkyl, or —C₆H₅;
—R₂ is H, C₁-C₄ alkyl, —CN, or —C₆H₅;
—R₃ is —H, —C₆H₅, or —Si(CH₃)₃; and
—R₄ is C₁-C₄ alkyl or phenyl.

2. A composition according to claim 1, having the formula $$\left[ L \left[ W \left[ \begin{array}{c} X_q \\ \phantom{x} \\ F_{4-q} \end{array} \right]_n W-L \right]_r \right.$$

wherein —L, —W—, —X, q, and n are as defined in claim 1 and r is an integer from 3 to 30 inclusive.

3. A composition according to claim 1, having the formula wherein —L, —W—, —X, q, and n are as defined in claim 1 and r is an integer from 3 to 30 inclusive.

4. A composition according to claim 1, wherein —W— is where A, p, Z, and m as defined in claim 1.

5. A composition according to claim 1, wherein —W— is selected from the group consisting of -continued and

6. A composition according to claim 1, wherein is selected from the group consisting of

31

-continued

32

-continued
and

* * * * *